United States Patent [19]

Runyon

[11] 4,222,086
[45] Sep. 9, 1980

[54] OVERCURRENT CONTROL DEVICE WITH FAIL-SAFE CIRCUITS

[76] Inventor: Robert S. Runyon, 7015 Brookview Rd., Hollins, Va. 24019

[21] Appl. No.: 850,841

[22] Filed: Nov. 11, 1977

[51] Int. Cl.² .............................................. H02H 3/08
[52] U.S. Cl. .......................................... 361/93; 361/1; 323/56; 323/89 R
[58] Field of Search ....................... 361/93, 1, 94, 208; 323/56, 89 R, 89 P, 89 M

[56] References Cited

U.S. PATENT DOCUMENTS

| 2,761,896 | 9/1956 | Foley et al. ....................... 361/208 X |
| 2,777,986 | 1/1957 | Bennett ................................... 323/56 |
| 3,256,407 | 5/1966 | Klein ................................ 361/115 X |
| 3,374,398 | 3/1968 | Horn et al. ........................ 323/56 X |
| 3,729,650 | 4/1973 | Cook .................................. 361/93 X |

*Primary Examiner*—Patrick R. Salce

[57] ABSTRACT

An overcurrent control device for protection of direct-current circuits, employing a saturable reactor to provide for electrical isolation and remote location of the overcurrent detection means from the protected circuit, is provided with additional windings on the reactor and a circuit to render the device fail-safe, while another embodiment provides fail-safe protection using a modified arrangement wherein the additional reactor windings are omitted.

12 Claims, 4 Drawing Figures

OVERCURRENT CONTROL DEVICE WITH FAIL-SAFE CIRCUITS

BACKGROUND OF THE INVENTION

This invention relates to an overcurrent control device whose function is to detect an overcurrent condition in a circuit carrying large amounts of direct current, and to protect the circuit against such a condition by causing an external interrupting device to open the circuit.

Several lines of approach to the task of overcurrent control have been employed in commercially available devices. An electromechanical relay capable of operation by a predetermined amount of current in the protected circuit constitutes the most direct approach, although it is difficult to make an adjustable device of this type capable of dependable operation at a sufficiently high level of current. For this reason and because numerous applications require the detection means to be adjustable from a location remote from the protected circuit to reduce the danger of electrical shock, more complex devices have been developed which allow a representative sample of the current in the protected circuit to be extracted and transmitted to the desired remote location, to control a detection means of conventional design and capable of dependable adjustment to a predetermined level. One such device employs a meter shunt or other series resistance in the protected circuit to develop a low-level voltage proportional to the current in the circuit, which voltage is then applied to a suitable detection circuit. Another device of prior art employs a saturable reactor which effectively transforms the cumbersome level of direct current in the protected circuit to a proportional and much lower alternating current for controlling the detection means. This approach also provides the desirable feature of complete electrical isolation of the detection means from the protected circuit, thus permitting sensitive semiconductor components to be used as desired without exposure to damage by high-voltage transients originating in the protected circuit. Devices such as these are characterized by a common detriment, in that the complexity added to meet the various needs of application affords numerous possibilities for component failure or broken connections whereby the intended function of circuit protection is lost without warning, thus creating a hazardous situation.

SUMMARY OF THE INVENTION

The present invention overcomes the stated detriment of earlier devices using a saturable reactor in combination with conventional detection means, by the addition of a circuit in which a relay responds by deenergization to either a detected overcurrent condition or a loss of continuity in the detection circuit or its power source, and initiates interruption of the protected circuit. A shorted reactor winding gives the same result by causing the detection means to prematurely sense an overcurrent condition. The added circuit including the relay is inherently fail-safe, as the relay must either become deenergized or continue to serve its intended purpose.

The relay is normally energized by current obtained from an additional pair of windings on the reactor, the windings serving to sense the current that normally flows in the detection circuit without interference therewith. Another embodiment employs semiconductor diodes to sense the current in the detection circuit and energize the relay, thereby eliminating the need for additional reactor windings.

DETAILED DESCRIPTION OF THE INVENTION

Figure 1:
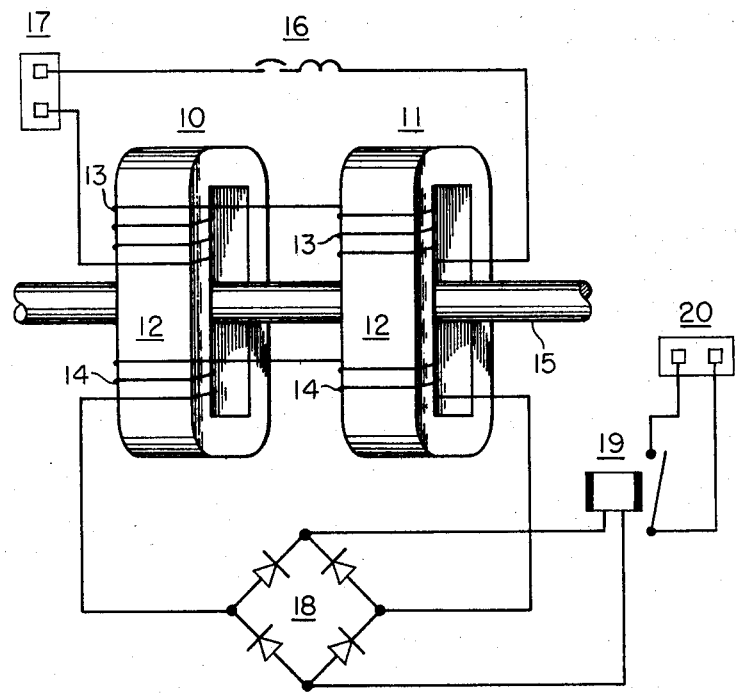
FIG. 1 is a schematic diagram of the device in which a conventional circuit breaker is used for overcurrent detection.

Referring to FIG. 1 of the drawing, in which like numerals correspond to like parts, the overcurrent control device employs a saturable reactor consisting of the combination of two similar sections 10 and 11, each comprising an annular core 12 of ferromagnetic material with two windings, designated as primary 13 and secondary 14. The direct-current circuit to be protected is represented in the drawing by conductor 15 which is a part of the circuit, and is extended through both cores in succession to form a single-turn control winding for the reactor. The primary windings 13 correspond to the output windings of a prior art saturable reactor.

The detection circuit of this invention is a series primary circuit comprising both primary windings 13, a circuit breaker 16 serving as detection means which automatically interrupts an electric current exceeding a predetermined amount, and a connector 17 whereby the primary circuit is energized from an external source of alternating current (not shown) of a predetermined voltage and frequency. The primary windings 13 are connected with opposite polarities with respect to conductor 15, such that direct current in the latter produces a magnetic field which becomes aided in one core and suppressed in the other core when unidirectional current flows in the primary windings.

A secondary circuit is constructed comprising both secondary windings 14 in series, their free ends being connected to a bridge rectifier 18 whose rectified output is then connected to the coil of an electromechanical relay 19. The secondary windings 14 are also connected with opposite polarities with respect to conductor 15, which gives them additive polarities with respect to the primary windings 13. An additional connector 20 is provided for connection of the contact of relay 19 to an external circuit for controlling an electromagnetic contactor, or other means for switching a high level of current, to close the protected circuit whenever relay 19 is energized. The contactor and its external circuit are of prior art and, being physically separate from the invention, are not shown in the drawing.

In operation, the saturable reactor functions as do those of prior art if one disregards the added secondary windings; a review of this function follows to facilitate understanding of the invention. When circuit breaker 16 is closed, alternating voltage from the source connected at 17 appears across the primary windings 13 causing an alternating current to flow therein, which is limited by the high inductance of the windings to a negligible amount if no current is present in conductor 15. However, when the protected circuit is in normal use there is a substantial amount of direct current in conductor 15, reaching levels of up to several thousand amperes in some applications, and magnetizing both cores 12 of the reactor far into saturation. The primary windings then assume a very low inductance, and the primary current abruptly increases to a level at which one section of the reactor, being energized by opposing currents, has its core driven out of saturation and regains its normal inductance, thus restricting further increase of current in the primary windings. When the voltage applied to the windings reverses polarity, the primary current will decrease sufficiently to permit the core to saturate again, at which time it will suddenly reverse its flow and increase to the same level whereupon the other core will be driven out of saturation, thus restricting further increase of current by the process described. Thus the primary current assumes a nearly square waveform, with its peaks controlled to a level at which the magnetic field intensity produced by either primary winding nearly cancels that produced by the current in conductor 15. This level is nearly proportional to the current in conductor 15 and is largely independent of the voltage of the source connected at 17.

The voltage applied to the primary windings 13 causes a proportional voltage to be induced in the secondary windings 14 by conventional transformer action. This voltage is then rectified by bridge rectifier 18 and applied to the coil of relay 19 causing its contact to close, which through external means initiates closure of the protected circuit as previously stated. The primary voltage may divide arbitrarily between the two sections 10 and 11 of the reactor, but since both sections are similar, the total voltage across both secondary windings depends only on the total primary voltage. As a result, when direct current flows in conductor 15 and the reactor cores alternately become saturated, the combined secondary voltage is unaffected except for voltage drop caused by the increased current flow through resistance in the primary circuit. Proper design requires that this resistance be sufficiently low to maintain relay 19 energized under worst-case conditions of high primary current with low primary voltage.

The current drawn by relay 19 causes an additional component of current to flow in the primary circuit, but being 90 degrees out of phase with the primary current otherwise present, its effect on the latter is to alter the waveform without substantially affecting the amplitude thereof. If relay 19 is selected to minimize the volt-ampere input needed for its energization, the effect on the primary current will be negligible. It should be noted that the secondary windings 14 may be connected directly to the coil of relay 19, thereby eliminating the need for bridge rectifier 18. However, with this arrangement a comparable relay designed for energization by alternating current is needed, which requires a much larger volt-ampere input of lagging power factor. The additional component of primary current that results is unnecessarily large and has an undesirable additive phase relationship to the primary current otherwise present.

The unexpected consequence of the foregoing is that the saturable reactor used in this invention functions both as a direct-current transformer (with respect to windings 15 and 13) and as a conventional alternating-current transformer (with respect to windings 13 and 14), with each function being independent of the other. The latter function permits the secondary windings to sense the presence of normal primary current, whose level is widely variable, and respond by supplying a nearly constant voltage to energize relay 19, without interfering with the former function which is requisite to the basic process of overcurrent detection.

When the primary current exceeds a predetermined level, indicating an overcurrent condition in the protected circuit (or possibly a shorted reactor winding), circuit breaker 16 opens and interrupts the flow of primary current. This eliminates the induction of voltage in the secondary windings 14, whereupon relay 19 becomes deenergized and opens its contact thus causing the external switching means to open the protected circuit and eliminate the overcurrent condition. The occurrence of an open-circuit condition in the device or failure of its alternating-current source will also deenergize relay 19 with the same result. Thus the direct-current circuit remains protected in the event of inadvertent failure of the overcurrent control device to function normally.

Figure 2:
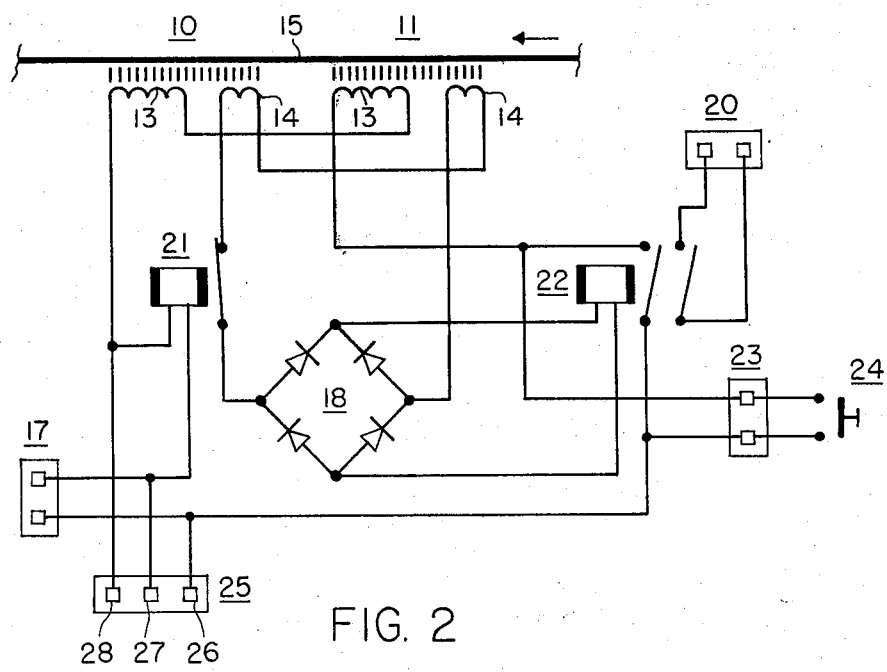
FIG. 2 shows a modified embodiment of the device in which the detection means is an adjustable relay and a latching circuit is provided to prevent inadvertent reclosure.

In the modified embodiment shown in FIG. 2, an adjustable electromechanical relay 21 serves as the detection means thus permitting separate connections to its coil and contact, the latter being normally closed and connected as a series element of the secondary circuit. The relay 22 is similar to the relay 19 shown in FIG. 1 but is provided with an additional contact which is connected in series with the primary windings 13 and the coil of relay 21 to establish a latching circuit. A connector 23 is provided whereby a pushbutton switch 24 or other reclosing means external to the invention is connected in parallel with the additional contact of relay 22. In operation, the momentary closure of switch 24 initially completes the primary circuit, whereupon relay 22 becomes energized and its additional contact closes to maintain continuity of the primary circuit against subsequent opening of the switch. An overcurrent condition is detected in relay 21 by a process analogous to that described previously, which causes its contact to open and deenergize relay 22 whose additional contact opens to break the primary circuit and prevent reclosure of relay 22 until switch 24 is again closed.

A receptacle 25 having three contacts 26 through 28 is included for convenient connection of a suitable calibration means (not shown) external to the device to facilitate test or adjustment of relay 21. It is intended that the calibration means shall obtain its power input from the available source of alternating current through contacts 26 and 27, and provide a low-voltage source of current of a known and adjustable level to be conducted through contacts 27 and 28 to the coil of relay 21.

A convenient and inexpensive embodiment of relay 21 is a commercially available solenoid (not separately shown) with a cylindrical armature designed to provide single-stroke linear motion, and equipped with a microswitch whose contact opens when the armature is fully seated. The solenoid is mounted vertically with its armature held withdrawn by gravity against a movable support, which is used to adjust the maximum extension of the armature and thus the sensitivity of current detection. A predetermined amount of current in the solenoid coil is thus sufficient to lift the armature which, having started to move, completes the movement and opens the microswitch. Since the latter remains closed until the armature is fully seated, hesitation or chatter of the switch contact is prevented. Adjustment ranges exceeding 3.5 to 1 have been realized by using a solenoid in this manner.

Figure 3:
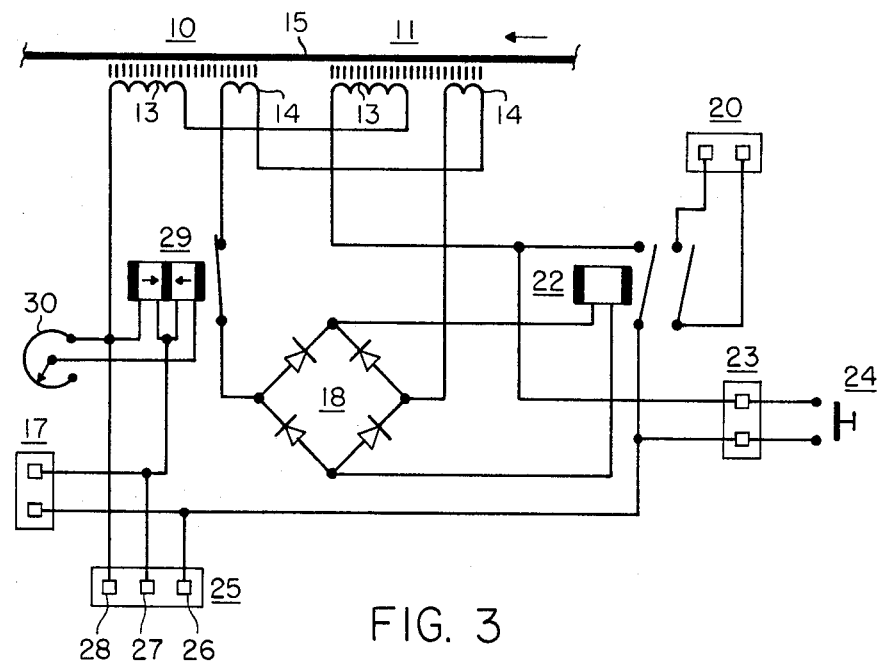
FIG. 3 shows a further modified embodiment of the device in which the detection means is a differential relay whose sensitivity is made adjustable by means of a rheostat.

Construction of the overcurrent control device may be simplified and its adjustment range increased by providing relay 21 with a parallel-connected rheostat to bypass an adjustable fraction of the primary current, thus eliminating the need of mechanical adjustment of the relay. The objection to this arrangement is that it defeats the fail-safe feature of the device, in that an open-circuit condition in the coil of relay 21 disables overcurrent detection without opening the primary circuit and therefore without interrupting the current in the protected circuit. This objection is overcome by further modifications resulting in the embodiment shown in FIG. 3, which includes as detection means a differential relay 29 having two similar coils, its contact being connected to function as in the preceding embodiment. The two coils of relay 29 are connected in series with the primary circuit and in parallel with each other such that primary current divides between the coils and produces opposing magnetic fields. A rheostat 30 or adjustable impedance is then inserted in series with one coil to permit the fraction of primary current that flows therein to be adjustable. The relay 29 will open its contact when the difference of the currents in the two coils exceeds a predetermined amount. The total primary current and therefore the direct current in conductor 15 at which overcurrent detection occurs are thus made adjustable by the rheostat 30.

It should be noted that the differential relay 29 has greater sensitivity to primary current when confined to a single coil than when divided between the two coils. Should an open-circuit condition occur in either of the parallel circuit paths including relay 29, the primary current is directed entirely into the other path and through a single coil of the relay, which thus retains its detection capability at a level of current equal to or lower than that for which previously adjusted.

Figure 4:
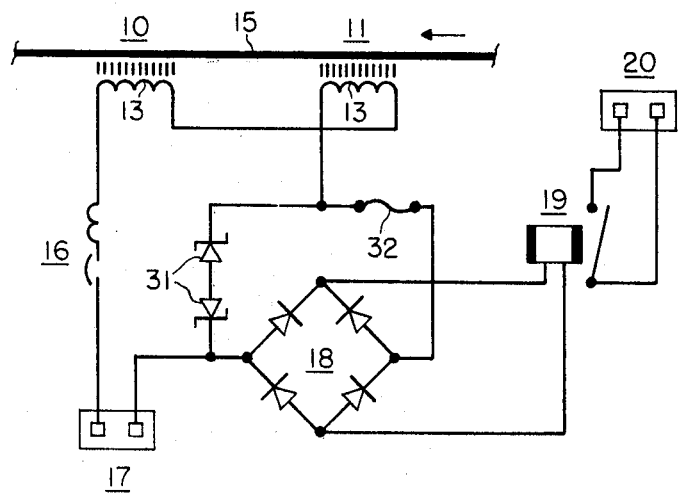
FIG. 4 shows an embodiment having detection means as used in FIG. 1, but with a modified circuit arrangement permitting the reactor to have fewer windings.

Another embodiment is shown in FIG. 4, in which the primary circuit is similar to that of FIG. 1 but also includes a series-connected opposing pair of zener diodes 31 or other semiconductor means capable of maintaining a constant voltage difference over the normal range of primary current. The circuit comprising bridge rectifier 18 and relay 19 is similar to that of FIG. 1 but is connected to obtain its electrical input from the voltage developed across diodes 31, and is provided with a series-connected fuse 32 or other means for protection of components 18 and 19 against an open-circuit condition in either of the diodes. With this arrangement the diodes 31 sense the presence of normal primary current and respond by supplying a constant voltage to energize relay 19. This function was served by secondary windings in the foregoing embodiments, which windings serve no purpose in this embodiment and are therefore omitted.

The magnetizing current that flows in the primary circuit when conductor 15 is devoid of current is diverted around the diodes 31 and must suffice to energize relay 19, whose volt-ampere input requirement then determines the voltage to be developed across diodes 31, which is likely to be a substantial part of the primary source voltage. With increased levels of primary current, the excess over that needed for the coil of relay 19 is shunted through diodes 31, which then dissipate as heat a considerable amount of power. This fact, together with the reduction of voltage available to energize the primary windings, presents design limitations peculiar to this embodiment; thus the embodiments that use secondary windings are to be preferred for general use.

The invention finds specific application in protecting direct-current circuits and systems used for supplying power to underground mining equipment, wherein it satisfies requirements recently promulgated by the Mining Enforcement and Safety Administration. This is not to be construed as limiting in scope, as the invention is useful in a variety of applications requiring safe and dependable detection of direct current in a circuit, with or without a requirement for automatic circuit interruption. It is apparent that the scope of application may be extended further by combining one or more features of a particular embodiment with those of another embodiment to meet specific needs.

What is claimed is:
1. An electrical control device comprising
 (A) a pair of magnetic cores,
 (B) first means to provide substantially equal saturating magnetomotive force (MMF) in both said cores in response to normal or abnormal unidirectional input current,
 (C) second means energized by alternating current to alternately maintain each of said cores in an unsaturated state when said normal or abnormal unidirectional input current is present, whereby the amount of said alternating current varies in correspondence with the amount of said input current,
 (D) third means to detect that said alternating current exceeds a predetermined abnormal amount, and
 (E) fourth means to sense the condition that said second means is energized, said fourth means providing a predetermined output voltage in response to said condition, said output voltage being substantially independent of said unidirectional input current.
2. The invention of claim 1 wherein said third means responds to current exceeding said abnormal amount by
 (A) interrupting said alternating current whereby said fourth means brings about loss of said output voltage, or selectively
 (B) interrupting said output voltage.
3. The invention of claim 2 including means for closing a contact, said closing means being energized by said output voltage.
4. The invention of claim 3 wherein said unidirectional input current becomes interrupted in response to the opening of said contact.
5. The invention of claim 1 wherein said first means is a control winding energized by said normal or abnormal unidirectional input current, and said second means is a primary winding arranged to provide MMF aiding in one said core and MMF suppressing in the other said core the MMF provided by said control winding.
6. The invention of claim 5 wherein said fourth means is a secondary winding arranged to have aiding polarity with respect to said primary winding on both said cores, said output voltage being provided by induction from said primary winding.
7. The invention of claim 1 wherein said invention responds indentically to
 (A) detection by said third means that said alternating current exceeds said abnormal amount, and
 (B) loss of said outout voltage, said loss resulting from

(1) a malfunction characterized by an open-circuit condition within said invention, or
(2) loss of voltage supplying said alternating current.

8. The invention of claim 3 wherein said closing means is a relay having a winding energized by said fourth means and a normally open contact operable in response thereto.

9. The invention of claim 3 with the further inclusion of a rectifier in the circuit connecting said output voltage to said closing means.

10. The invention of claim 3 wherein said third means is a relay having a winding energized from said alternating current and a normally closed contact in the circuit connecting said output voltage to said closing means.

11. In electrical apparatus, a saturable reactor comprising
(A) a pair of magnetic cores,
(B) a control winding arranged to provide substantially equal saturating magnetomotive force (MMF) in both said cores in response to normal or abnormal unidirectional input current in said winding,
(C) a primary winding energized by alternating current to alternately maintain each of said cores in an unsaturated state when said normal or abnormal unidirectional input current is present, and
(D) a secondary winding arranged to provide output voltage by induction from said primary winding; said reactor being characterized by two substantially independent simultaneous functions, whereby
(A) the amount of said unidirectional alternating current varies in correspondence with the amount of said input current, and
(B) the amount of said output voltage varies in correspondence with the amount of voltage supplying said alternating current to said primary winding.

12. The invention of claim 11 wherein said secondary winding is arranged to have aiding polarity with respect to said primary winding on both said cores, and said primary winding is arranged to provide MMF aiding in one said core and MMF suppressing in the other said core the MMF provided by said control winding.

* * * * *